United States Patent
Park et al.

[11] Patent Number: 5,944,889
[45] Date of Patent: Aug. 31, 1999

[54] METHODS OF HEAT-TREATING SEMICONDUCTOR WAFERS

[75] Inventors: Jae-guen Park; Gon-sub Lee; Kyoo-chul Cho, all of Kyungki-do; Ho-kyoon Chung, Seoul, all of Rep. of Korea

[73] Assignee: Samsung Electronics Co., Ltd., Rep. of Korea

[21] Appl. No.: 08/978,937

[22] Filed: Nov. 26, 1997

[30] Foreign Application Priority Data

Nov. 29, 1996 [KR] Rep. of Korea ............. 96-60025

[51] Int. Cl.⁶ ............................................. C30B 25/20
[52] U.S. Cl. ................. 117/94; 117/97; 117/106; 438/58; 438/471
[58] Field of Search ................. 117/90, 94, 97, 117/106; 438/58, 471

[56] References Cited

U.S. PATENT DOCUMENTS

| | | | |
|---|---|---|---|
| 4,344,815 | 8/1982 | Cazarra et al. | 438/10 |
| 4,417,943 | 11/1983 | Jacques et al. | 117/15 |
| 4,505,759 | 3/1985 | O'Mara | 438/143 |
| 4,809,196 | 2/1989 | Miller | 436/4 |
| 4,851,358 | 7/1989 | Huber | 438/471 |
| 4,868,133 | 9/1989 | Huber | 438/471 |
| 5,272,119 | 12/1993 | Falster | 438/58 |
| 5,385,115 | 1/1995 | Tomioka et al. | 117/2 |
| 5,506,176 | 4/1996 | Takizawa | 438/476 |

*Primary Examiner*—Felisa Hiteshew
*Attorney, Agent, or Firm*—Myers Bigel Sibley & Sajovec

[57] ABSTRACT

With a view to optimizing the donor killing process performed in the semiconductor wafer fabricating process, a heat-treating operation is performed in a thermal furnace above at least 900 ° C. for a predetermined time so that growth of the initial oxygen precipitates, induced into the crystal lattices during single-crystal growth, is suppressed. Thus, the oxygen precipitates are easily suppressed, irrespective of the concentration of the initial oxygen, so that the yield of the semiconductor device is improved

8 Claims, 5 Drawing Sheets

METHODS OF HEAT-TREATING SEMICONDUCTOR WAFERS

BACKGROUND OF THE INVENTION

1. Field of the Invention

The present invention relates to a semiconductor wafer and a method of heat-treating the same and, more particularly, to a heat-treating method in a donor killing process which is performed to remove a role of donor of interstitial oxygen in the crystal during single-crystal growth in a semiconductor wafer fabricating process and a semiconductor wafer shaped by the heat-treating method.

2. Discussion of Related Art

Very large scale integration circuit (VLSI) is that high-density devices are integrated on a single-crystal semiconductor wafer. A general semiconductor wafer fabricating process will be described with reference to FIG. 1.

Figure 1:
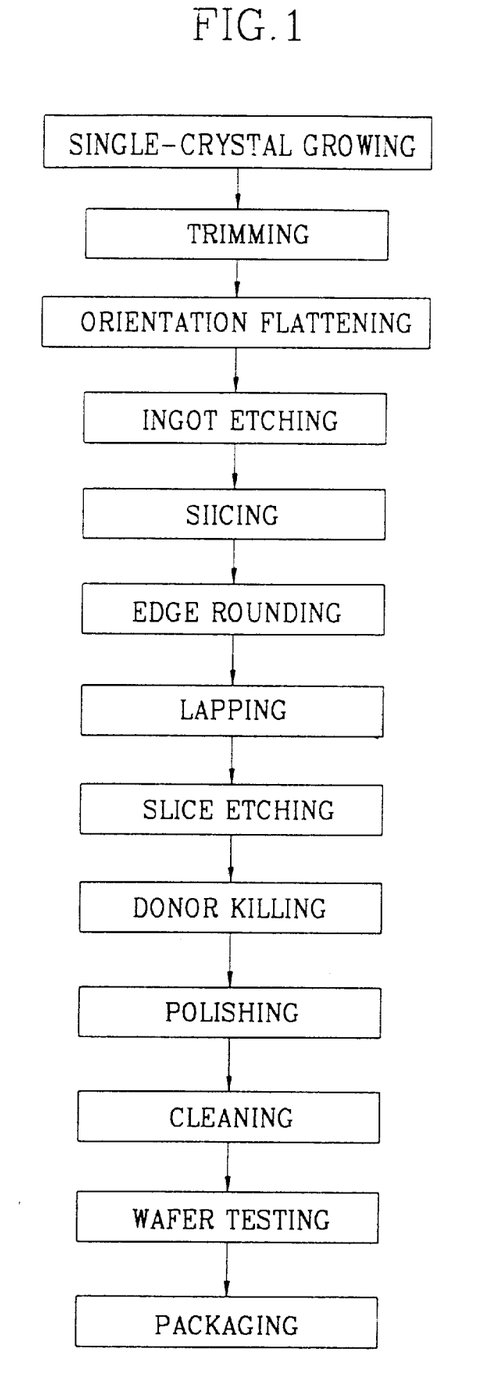
FIG. 1 is a flow chart illustrating sequence in a general semiconductor water fabricating process.

First, a single crystal is grown from raw materials. The single-crystal growing process is that after the raw materials like quartzite, etc. are shaped into a polycrystalline silicon through complex and multilevel purifying process, it is grown into a single-crystal ingot by the Czochralski (CZ) technique or the Float Zone (FZ) technique.

Following the growth of the single-crystal ingot, a wafer, being an adequate material in semiconductor device fabrication, is shaped through performing a series of complex shaping and polishing process. This process is called "watering".

That is, since the surface of the single-crystal ingot is ruggedly formed, a trimming process is necessary for trimming the ingot surface to have an adequate shape and size. The ingot trimmed is oriented in the desired direction along its length after one or more flats have been examined by X-ray (Orientation Flattening). Then, an ingot etching operation is performed to remove contaminants from the ingot surface and a slicing process is performed to make a silicon slice out of the ingot. The slicing process is carefully performed in order to correctly keep the crystal direction of the slice. Thereafter, the edge of each silicon slice, sliced into that having a predetermined thickness, is rounded to give a continual convenience in treating the wafer and not to accumulate a layer on the edge of the wafer in the subsequent device fabricating (Edge Rounding).

Thereafter, the slice is lapped by the use of mixtures of oxide aluminum and glycerin to prevent it from bending so that its flatness increases. The previously described shaping operations leave the surface and edges of the wafer damaged and contaminated. The damaged and contaminated regions can be removed by chemical etching (Slice Etching).

Following that operation, a heat-treating process called "donor killing" is performed. The donor killing process is generally performed in a thermal furnace at 600 to 650° C. for 30 minutes. While, in a Rapid thermal Annealing (RTA) device, the process is performed around 700° C. for 30 seconds. Since the interstitial oxygen existed in the single-crystal lattices of the silicon is positively or negatively charged to thereby have a role of donor in the crystal lattices, the donor killing operation is to remove the interstitial oxygen which deteriorates the electrical control by use of an implantation process with respect to the wafer. The phenomenon caused by the interstitial oxygen is eradicated by performing a heat-treating operation above 500° C.

Then, the surface of the heat-treated slice is polished chemically or mechanically and cleaned. An inspection in the defects and orientation of the cleaned wafer is performed and an packing is performed for the passed wafer.

Meanwhile, when a single-crystal silicon is grown by the conventional Czochralski technique, plentiful of oxygen is generated. It typically exists in the range of $5 \times 10^{17}$ to $1 \times 10^{18}$ atoms/cm$^3$ (or 10 to 20 ppma). The initial oxygen (Oi) induced in the crystal growing process is atomically dissolved and occupies the interstitial sites of the lattice. It becomes the most important precipitation material in the silicon wafer shaped by the Czochralski technique due to its characteristics that the degree of diffusion is very high and the solubility rapidly falls at low temperature. The oxygen precipitates grown from the initial oxygen is extremely undesirable in the electrical characteristic of the semiconductor device and is closely connected with the Electrical Die Sorting (EDS) process or the yield of the package. Thus, it should be removed or suppressed.

Figure 2:
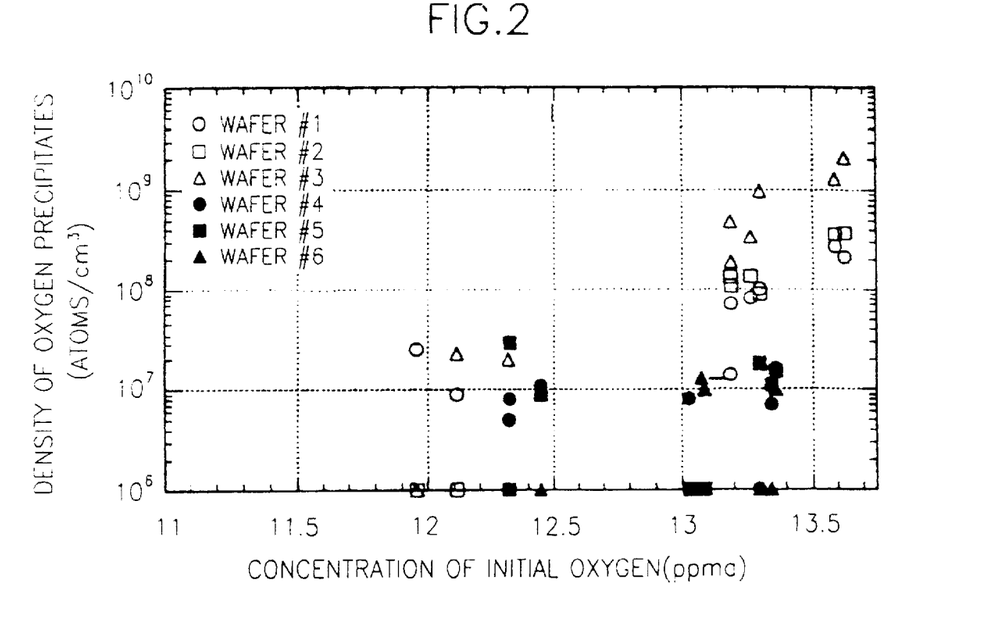
FIG. 2 is a graph measuring the correlation between the initial oxygen concentration and the oxygen precipitate density after performing the semiconductor DRAM process with respect to the particular wafers shaped in accordance with the conventional method.

FIG. 2 is a graph measuring the correlation between the initial oxygen concentration and the oxygen precipitate density after performing the Dynamic Random Access Memory (DRAM) process on the particular wafers passing through the conventional donor killing process.

The wafers #1 to #6 are silicon wafers fabricated through the single-crystal growing process by the Czochralski technique, and are products of particular wafer manufacturers. Each wafer previously passed the gate oxide module formation during the DRAM process. Concerning each wafer, the density of the oxygen precipitates existed in the active region of DRAM is measured by means of the Laser Scattering Tomography (LST) device. Distribution of the oxygen precipitates measured lies in the range of 200 to 400 $\mu$m.

From FIG. 2, it can be known that the density of the oxygen precipitates in each wafer increases as does the initial oxygen concentration. That is, the initial interstitial oxygen induced into the crystal during single-crystal growth acts as the nucleation-element of the oxygen precipitates.

Figure 3:
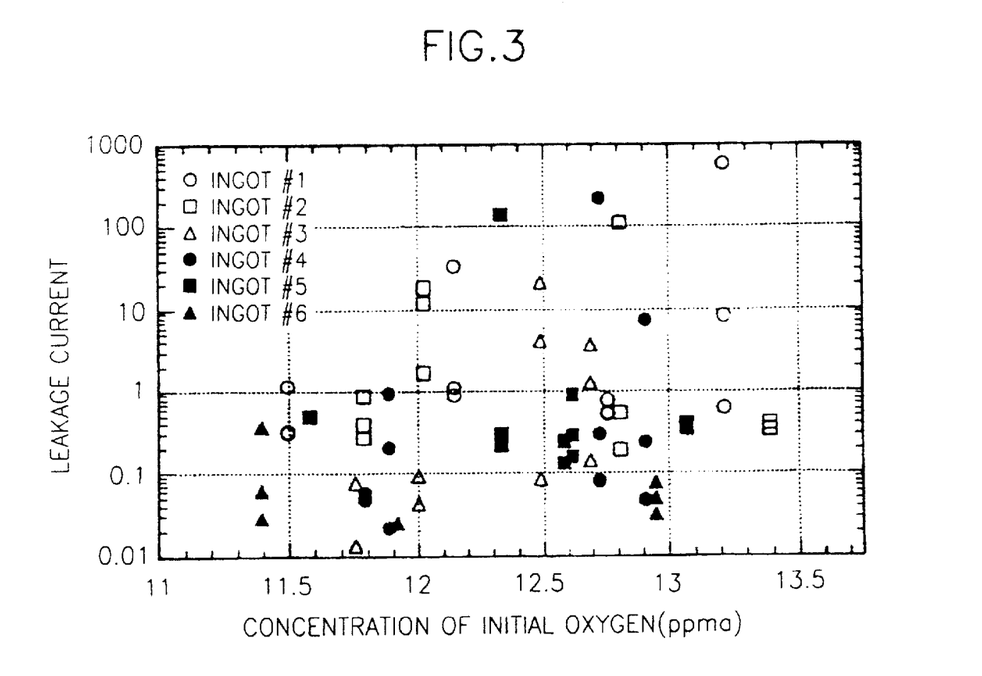
FIG. 3 is a graph measuring the correlation between the initial oxygen concentration and the substrate leakage current after performing the semiconductor DRAM process with respect to the particular ingots shaped in accordance with the conventional method.

FIG. 3 is a graph measuring the correlation between the initial oxygen concentration and the substrate leakage current after performing the semiconductor DRAM process concerning each wafer processed from the given ingots.

These measuring operations are performed with respect to the ingots #1 to #6 in the substrate voltage 20 V. From FIG. 3, it might be expected that the substrate leakage current usually increases with respect to the ingot having higher initial oxygen concentration. The reason is that the oxygen precipitates increase in accordance with the increase of the initial oxygen concentration so that the leakage element of the semiconductor substrate increases.

Figure 4:
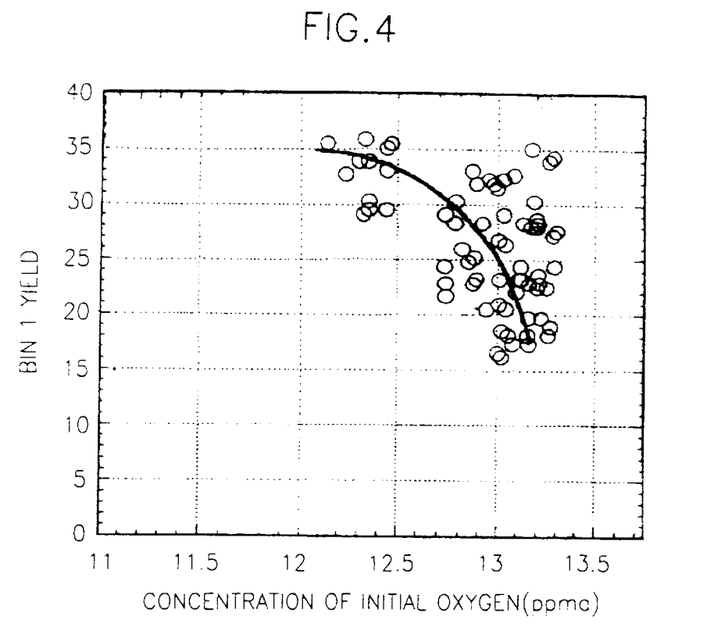
FIG. 4 is a graph measuring the correlation between the initial oxygen concentration and the Bin 1 yield after performing the semiconductor DRAM process with respect to the wafers shaped in accordance with the conventional method.

FIG. 4 is a graph measuring the correlation between the initial oxygen concentration and the Bin 1 yield with respect to the wafers passed the semiconductor 16 M DRAM.

The Bin 1 yield indicates that passed the Bin 1 test (so-called, prime good) which is done as a step of the Electrical Die Sorting (EDS) process performing an electrical characteristic test of each chip with respect to the wafer embodying particular devices.

FIG. 4 shows that the Bin 1 yield decreases in the relation of the complementary error function, indicated by a solid line, as the initial oxygen concentration increases. That is, rapid decrease in the Bin 1 yield occurs when the initial oxygen concentration is above 12.50 ppma (parts per million atoms).

Figure 5:
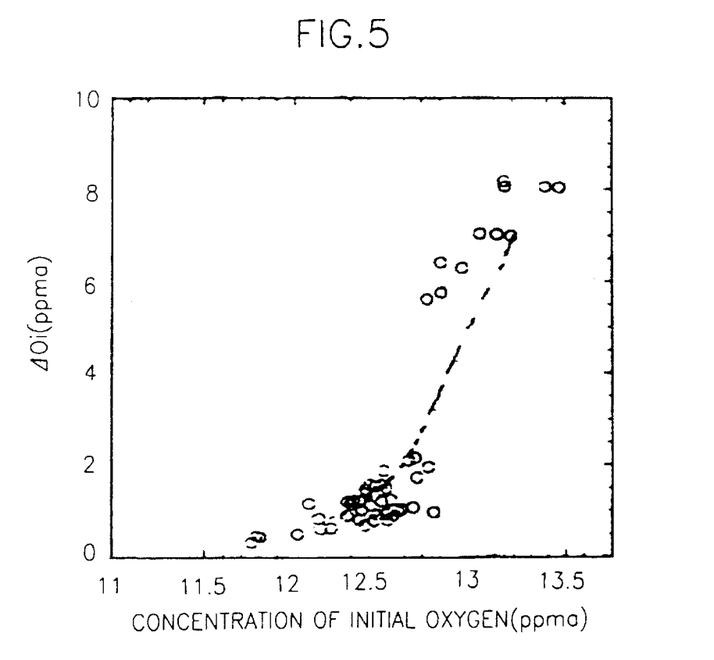
FIG. 5 is a graph representing the difference in oxygen concentration before and after the heat-treatment versus the initial oxygen concentration to obtain the good yield in the semiconductor DRAM.

FIG. 5 is a graph representing difference in oxygen concentration ($\Delta$Oi) before and after the heat-treatment versus the initial oxygen concentration for obtaining the good yield in the semiconductor DRAM fabricated by the use of the usual semiconductor wafer. The oxygen concentration difference is measured with the Fourier Transform Infrared (FTIR) spectrometer. As shown in the drawing, the wafer is heat-treated in a thermal furnace at 700° C. for 20 hours, and in succession, at 1000° C. for 10 hours.

As might be expected from the correlation between FIGS. 4 and 5, the Bin 1 yield rapidly decreases around the initial oxygen concentration 12.50 ppma, being an alteration point. And correspondingly, when the initial oxygen concentration is above 12.50 ppma, the oxygen concentration difference ($\Delta Oi$) rapidly increases. On the contrary, when the initial oxygen concentration is below 12.50 ppma, the Bin 1 yield is kept very high above 35 % and the oxygen concentration difference is kept very stably below 2 ppma.

Therefore, it is required in the semiconductor wafer fabrication that the initial oxygen concentration in the semiconductor wafer is kept below 12.50 ppma to obtain the good yield of the device.

However, to keep the initial oxygen concentration in the semiconductor wafer below an permissible value, for example, 12.50 ppma, not only a careful interest should be made from the beginning of single-crystal growth, but also a high cost of single-crystal growing device is required. Thus, the cost of the semiconductor wafer increases.

Also, even in a high precision of single-crystal growing device, it is very difficult to precisely control the concentration of the initial oxygen induced during crystal growth.

Furthermore, although the initial oxygen concentration in the semiconductor wafer might be precisely controlled, distribution of the initial oxygen concentration with respect to each wafer is variously dispersed so that it is difficult to precisely control the characteristics of the wafer.

SUMMARY OF THE INVENTION

Accordingly, the present invention is directed to a method of heat-treating a semiconductor wafer which substantially obviates one or more of the problems due to limitations and disadvantages of the related art.

An object of the present invention is to provide a semiconductor wafer heat-treating method for removing the potentially harmful effect that the interstitial oxygen induced in the crystal lattice during single-crystal growth is settled into oxygen precipitates and influences the semiconductor device succeedingly shaped on the wafer.

Another object of the present invention is to provide a semiconductor wafer heat-treating method for removing the evil effect that the initial oxygen influences the semiconductor device, irrespective of the concentration of the interstitial oxygen induced into the crystal lattices during single-crystal growth.

Still another object of the present invention is to provide a semiconductor wafer heat-treating method for removing the evil effect that the initial oxygen influences the semiconductor device, in a simple way without precisely controlling the interstitial oxygen induced into the crystal lattices during single-crystal growth.

Yet another object of the present invention is to provide a semiconductor wafer embodying good semiconductor devices, irrespective of the initial oxygen concentration of the wafer.

Yet another object of the present invention is to provide a semiconductor wafer in which the oxygen precipitates are suppressed, irrespective of the initial oxygen concentration of the wafer.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the inventive semiconductor wafer heat-treating method for removing defects induced into the crystal when the semiconductor crystal, grown into a single crystal, is fabricated into the unit wafers, performs the heat-treating operation with respect to the semiconductor wafer above 900° C. for a predetermined time.

Growth of the precipitates is advantageously suppressed by performing the heat-treating operation in the thermal furnace at 900° C. for at least 20 minutes or more, and otherwise, at 1000° C. for at least 10 minutes or more.

The inventive semiconductor wafer fabricated out of the semiconductor crystal, grown into a single crystal, keeps the oxygen concentration difference before and after the heat-treatment below 2 ppma, irrespective of the initial oxygen concentration in the crystal.

With a view to controlling the yield, the oxygen concentration difference is kept below 2 ppma in condition that the initial oxygen concentration is in the range of 10 to 20 ppma, and more advantageously, 11 to 15 ppma.

As described above, the method of the present invention entirely differs from the conventional one which reduces the initial oxygen concentration during single-crystal growth in the semiconductor wafer shaping process and is used for suppressing generation of the oxygen precipitates causing deterioration in the yield of the semiconductor device. The inventive method is to suppress the nucleation and nucleus-growth of the initial oxygen, irrespective of the concentration of the initial precipitates induced during single-crystal growth. That is, the method is to control the generation and growth of the oxygen precipitates through the heat-treating process in which temperature and time are controlled.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in to constitute a part of this specification, illustrate 5 embodiments of the invention and together with the description serve to explain the principles of the invention.

In the drawings.

DETAILED DESCRIPTION OF PREFERRED EMBODIMENT

Reference will now be made in detail to the preferred embodiments of the present invention, examples of which are illustrated in the accompanying drawings.

The present invention concerns development of the heat-treating method, not for suppressing the concentration of the initial oxygen to being induced into the crystal during single-crystal growth, but for preventing the initial oxygen pre-existed in the interstitial sites-of the crystal from growing into the oxygen precipitates in the semiconductor device fabricating process. Experiments concerning optimization of the heat-treating temperature and time condition are, therefore, performed with respect to the semiconductor wafer.

Generally, as is in the previously described semiconductor wafering process, the single-crystal semiconductor is sliced into wafer units. Then, chemical etching is performed with respect to the sliced wafers to remove the contaminants from them. Thereafter, each wafer suffers heat-treatment called a donor-killing process to suppress the role of donor of the initial oxygen. The present invention is to realize an optimal condition of the donor killing process.

First, to perform the donor killing process, each wafer sampled suffers a heat-treating operation in the thermal furnace for a predetermined time, differing in temperature.

The heat-treating operations are respectively performed at 650° C. 800° C. 900° C. 1000° C. and 1100° C. for 30 minutes with an identical criterion. The thermal furnace is that generally used in the semiconductor fabricating industry and basically installing with a heating unit, a temperature control unit, a gas feeding unit, a wafer loading unit, etc. For example, a crosswise or lengthwise furnace can be used.

In the meantime, the wafer according to a preferred embodiment of the present invention is a silicon semiconductor and is grown into a single-crystal semiconductor by the Czochralski technique.

Figure 6:
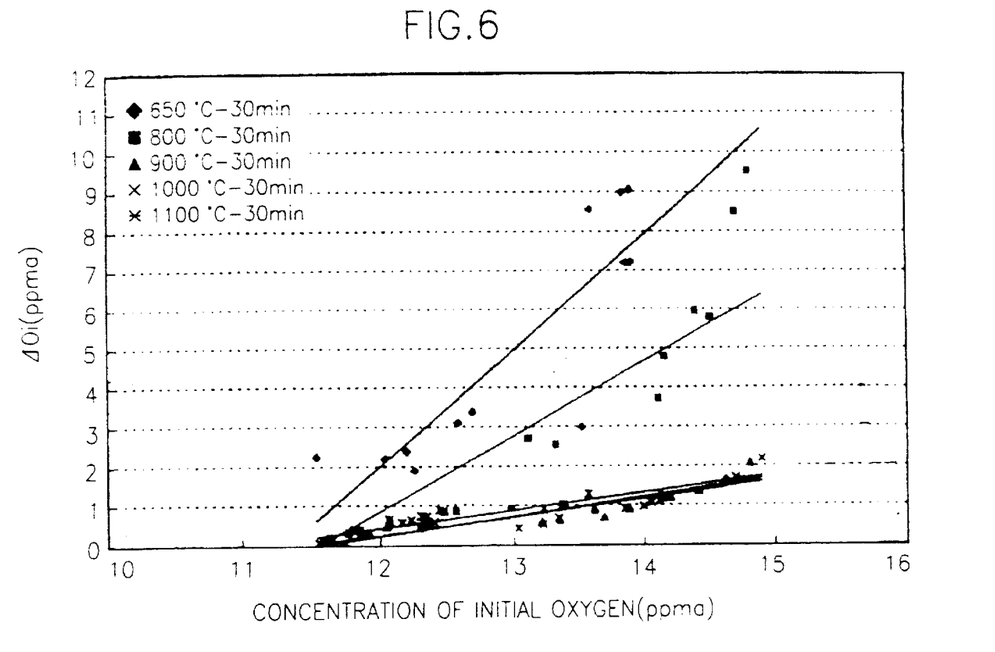
FIG. 6 is a graph measuring the oxygen concentration difference before and after the heat-treatment versus the initial oxygen concentration after performing the heat-treating operation with respect to the wafer at each temperature condition for 30 minutes.

FIG. 6 is a graph measuring the difference in oxygen concentration ΔOi before and after the heat-treatment versus the initial oxygen concentration with the FTIR spectrometer after performing the DRAM simulation test with respect to each wafer heat-treated. The oxygen concentration difference is is proportional to the density of the oxygen precipitates grown in the heat-treating process.

From FIG. 6, it can be known that the oxygen concentration difference ΔOi before and after the heat-treatment increases as does the initial oxygen concentration, in all the wafers measured after the experiment. But, the characteristic of the oxygen concentration difference before and after the heat-treatment is different when the heat-treating operation is performed at 650° C. or 800° C. and when it is performed at 900° C. 1000° C. and 1100° C. respectively. That is, as stated previously with reference to FIGS. 4 and 5, the oxygen concentration difference before and after the heat-treatment for keeping the Bin 1 yield in a good state is below 2 ppma, and as illustrated in FIG. 6, the heat-treating temperature condition, in which the oxygen concentration difference before and after the heat-treatment is below 2 ppma, is above 900° C.

Figure 7:
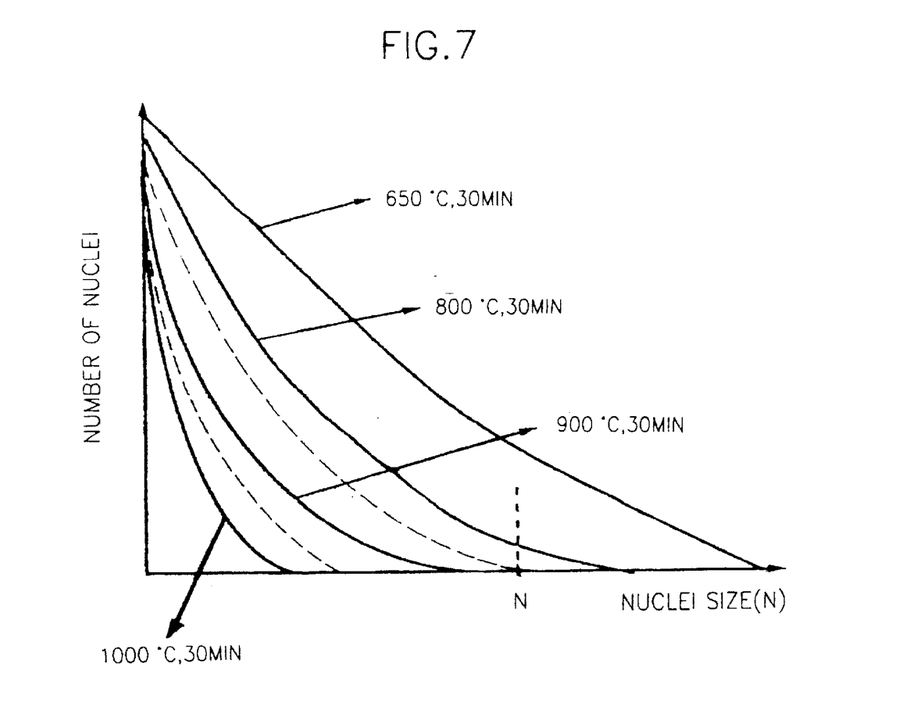
FIG. 7 is a graph conceptually representing the temperature dependence of the nucleation number with respect to the nucleus size computed by the classical nucleation theory.

FIG. 7 is a graph conceptually representing the temperature dependence of the nucleation number versus the nucleus size computed by the classical nucleation theory with respect to above experimental data. In the drawing, the abscissa represents the nucleus size of the oxygen precipitates, the ordinate the nucleation number of the oxygen precipitates, and N* of the abscissa the critical nucleus size. When the nucleus size of the oxygen precipitates is reduced below the critical nucleus size, the nucleus growth does not occur even in the nucleating operation.

As illustrated in FIG. 7, when the donor killing process is performed below 800° C., the nuclei having the size above the critical one of nucleus are present so that the oxygen precipitates is nucleated. On the contrary, when the process is performed above 900° C., nucleation is suppressed even in the existence of the nuclei in accordance with the initial oxygen. Therefore, when the heat-treating operation is performed above at least 900° C., the generation and growth of the oxygen precipitates are suppressed so that the oxygen concentration difference before and after the heat-treatment becomes lower below 2 ppma.

Thereafter, to optimize the time condition of the donor killing process, the oxygen concentration difference before and after the heat-treatment is measured with respect to each wafer after fixing the temperature condition of the thermal furnace at 900° C. and 1000° C. and changing the time condition.

Figure 8:
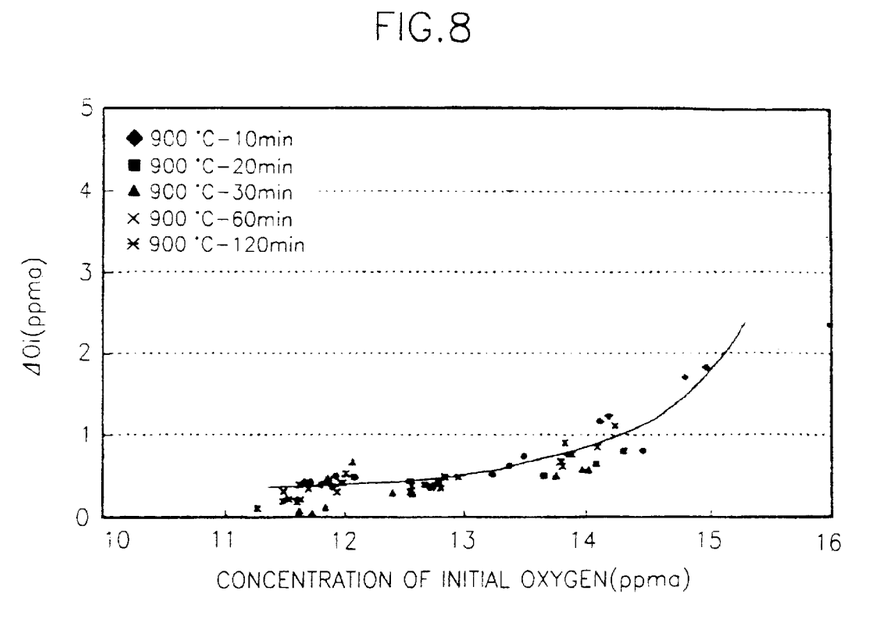
FIG. 8 is a graph measuring the oxygen concentration difference before and after the heat-treatment versus the initial oxygen concentration at 900° C. for the annealing time.
Figure 9:
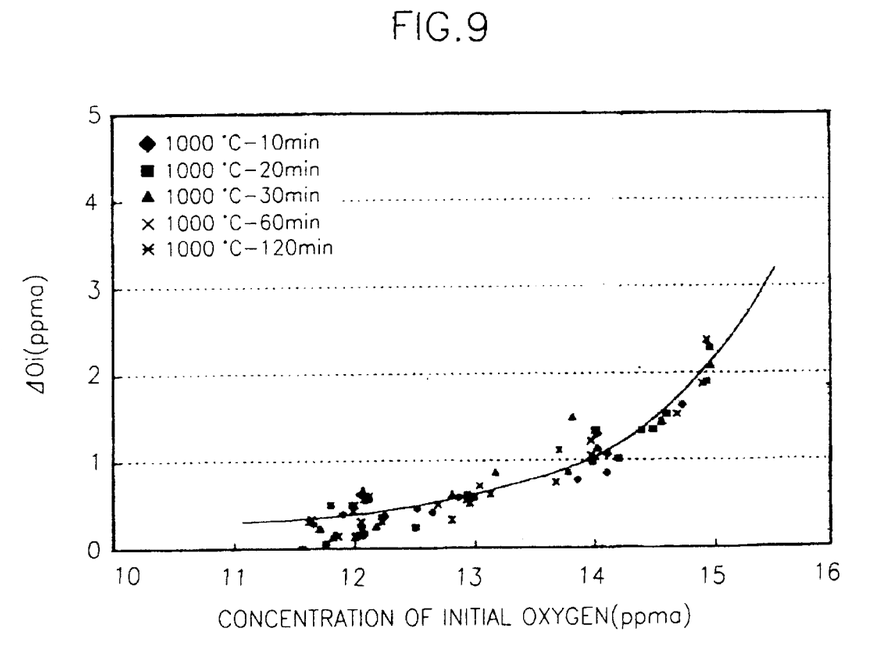
FIG. 9 is a graph measuring the oxygen concentration difference before and after the heat-treatment versus the initial oxygen concentration at 1000° C. for the annealing time.

FIG. 8 is a graph measuring the oxygen concentration difference before and after the heat-treatment versus the initial oxygen concentration after performing the DRAM simulation test with respect to each wafer, heat-treated at 900° C. while changing the annealing time. FIG. 9 is a graph measuring the oxygen concentration difference before and after the heat-treatment versus the initial oxygen concentration after performing the DRAM simulation test with respect to each wafer, heat-treated at 1000° C. while changing the annealing time.

As shown in FIG. 8, it might be expected that when the donor killing process is performed at 900° C. for at least 20 minutes or more, the oxygen concentration difference before and after the heat-treatment is kept below 2 ppma. In particular, when the initial oxygen concentration is in the range of 11.00 to 15.00 ppma, the oxygen concentration difference before and after the heat-treatment is kept below 2 ppma, irrespective of the initial oxygen concentration.

In the meantime, as shown in FIG. 9, when the donor killing process is performed at 1000° C. for at least 10 minutes or more, the oxygen concentration difference before and after the heat-treatment is kept below 2 ppma. In particular, when the initial oxygen concentration is in the range of 11.00 to 15.00, the oxygen concentration difference before and after the heat-treatment is satisfactorily kept below 2 ppma, irrespective of the initial oxygen concentration.

Therefore, in the semiconductor device fabricated using the semiconductor wafer according to the present invention, generation of the oxygen precipitates is suppressed and the oxygen concentration difference before and after the heat-treatment is kept below 2 ppma so that the yield of the semiconductor device is greatly improved.

Also, generation of the oxygen precipitates is suppressed below a predetermined range, irrespective of the initial oxygen concentration so that the yield of the semiconductor device is improved.

It will be apparent to those skilled in the art that various modifications and variations can be made in the semiconductor wafer heat-treating method of the present invention without departing from the spirit or scope of the invention. Thus, it is intended that the present invention cover the modifications and variations of this invention provided they come within the scope of the appended claims and their equivalents.

What is claimed is:

1. A method of treating a semiconductor wafer comprising subjecting the semiconductor wafer to a temperature of at least 900° C. to suppress the formation of oxygen precipitates in a crystal contained in the semiconductor wafer, and wherein the semiconductor wafer has an initial oxygen concentration prior to said subjecting step and a final oxygen concentration subsequent to said subjecting step and wherein the difference between the initial and final oxygen concentration is below 2 ppma.

2. A method according to claim 1, wherein said subjecting step is carried out at 1000° C. for at least 10 minutes.

3. A method according to claim 1, wherein the semiconductor wafer comprises silicon.

4. A method according to claim 1, wherein the subjecting step is carried out in conjunction with a single-crystal growth process performed by the Czochralski technique.

5. A method according to claim 4, further comprising the step of polishing said semiconductor wafer.

6. A method according to claim 1, wherein said subjecting step is performed in conjunction with a donor killing process.

7. A method according to claim 1, wherein said subjecting step is carried out in a furnace.

8. A method according to claim 1, wherein said subjecting step is carried out at 900° C. for at least 20 minutes.

* * * * *

UNITED STATES PATENT AND TRADEMARK OFFICE
CERTIFICATE OF CORRECTION

PATENT NO. : 5,944,889  
DATED : August 31, 1999  
INVENTOR(S) : Jae-guen Park, Gon-sub Lee, Kyoo-chul Cho, Ho-kyoon Chung It is certified that error appears in the above-identified patent and that said Letters Patent is hereby corrected as shown below:

Column 3,
Lines 47 and 53, correct "evil" to read -- potentially harmful --.

Signed and Sealed this

Eighteenth Day of September, 2001

*Attest:*

NICHOLAS P. GODICI
*Attesting Officer*     *Acting Director of the United States Patent and Trademark Office*

UNITED STATES PATENT AND TRADEMARK OFFICE
CERTIFICATE OF CORRECTION

PATENT NO.    : 5,944,889                              Page 1 of 1
DATED         : August 31, 1999
INVENTOR(S)   : Jae-guen Park, Gon-sub Lee, Kyoo-chul Cho, Ho-kyoon Chung It is certified that error appears in the above-identified patent and that said Letters Patent is hereby corrected as shown below:

<u>Drawings,</u>
Please insert the title -- PRIOR ART -- on Figures 1-5.

Signed and Sealed this

Second Day of April, 2002

Attest:

JAMES E. ROGAN
*Attesting Officer*          *Director of the United States Patent and Trademark Office*